United States Patent [19]

Haluska et al.

[11] Patent Number: 5,635,249

[45] Date of Patent: *Jun. 3, 1997

[54] LUMINESCENT CERAMIC COATINGS

[75] Inventors: Loren A. Haluska; Keith W. Michael; Udo C. Pernisz, all of Midland, Mich.

[73] Assignee: Dow Corning Corporation, Midland, Mich.

[*] Notice: The portion of the term of this patent subsequent to Feb. 7, 2012, has been disclaimed.

[21] Appl. No.: 346,651

[22] Filed: Nov. 30, 1994

Related U.S. Application Data

[63] Continuation-in-part of Ser. No. 28,063, Mar. 8, 1993.

[51] Int. Cl.$^6$ ................................................ B05D 3/02
[52] U.S. Cl. .................... 427/387; 427/226; 427/228; 427/376.6; 428/698; 524/420; 524/424
[58] Field of Search .......................... 428/689, 698, 428/702, 704; 427/376.2, 387, 397.7, 228

[56] References Cited

U.S. PATENT DOCUMENTS

| | | | |
|---|---|---|---|
| 3,986,997 | 10/1976 | Clark | 524/300 |
| 4,756,977 | 7/1988 | Haluska et al. | 428/704 |
| 5,290,354 | 3/1994 | Haluska | 524/484 |
| 5,380,553 | 1/1995 | Loboda | 427/226 |
| 5,387,480 | 2/1995 | Haluska et al. | 428/698 |

*Primary Examiner*—Tae Yoon
*Attorney, Agent, or Firm*—Roger E. Gobrogge

[57] ABSTRACT

The present invention relates to a method of forming luminescent coatings on substrates and the substrates coated thereby. The method comprises applying a coating comprising hydrogen silsesquioxane resin and a phosphor filler on a substrate and heating the coated substrate at a temperature sufficient to convert the hydrogen silsesquioxane resin to a ceramic coating.

10 Claims, No Drawings

LUMINESCENT CERAMIC COATINGS

This is a continuation-in-part of copending application Ser. No. 08/028,063 filed on Mar. 8, 1993.

BACKGROUND OF THE INVENTION

The present invention relates to luminescent coatings formed from hydrogen silsesquioxane resin and phosphor fillers. These coatings are useful on a variety of substrates.

The use of hydrogen silsesquioxane derived ceramic coatings on substrates such as electronic devices is known in the art. For instance, Haluska et al. in U.S. Pat. No. 4,756,977 disclose a process for forming a silica coating on an electronic substrate wherein a solution of hydrogen silsesquioxane resin is applied to a substrate followed by heating the coated substrate in air at a temperature in the range of 200°–1000° C. This reference, however, does not describe the use of fillers within the coating.

Similarly, the use of fillers within ceramic coatings is also known in the art. For instance, U.S. Pat. No. 3,986,997 describes a composition comprising an acidic dispersion of colloidal silica and hydroxylated silsesquioxane in an alcohol-water medium which can be used to apply transparent abrasion resistant coatings on a variety of substrates. The reference, however, does not describe the use of hydrogen silsesquioxane nor the application of a coating on an electronic substrate.

The present inventors have now discovered that luminescent coatings can be formed from compositions comprising hydrogen silsesquioxane resin and phosphor fillers.

SUMMARY OF THE INVENTION

The present invention relates to a method of forming a luminescent coating on a substrate and the substrate coated thereby. The method comprises first applying a composition comprising hydrogen silsesquioxane resin and a phosphor filler onto the substrate. The coated substrate is then heated at a temperature sufficient to convert the composition to a luminescent ceramic coating.

The present invention also relates to a coating composition comprising hydrogen silsesquioxane resin and a phosphor filler diluted in a solvent.

DETAILED DESCRIPTION OF THE INVENTION

The present invention is based on the discovery that luminescent coatings can be formed from compositions comprising hydrogen silsesquioxane resin and phosphors. The method of this invention is advantageous in that (1) these compositions do not require high temperature pyrolysis to burn-out carbon since the hydrogen silsesquioxane is essentially carbon-free and (2) the coatings do not crack under stress since the hydrogen silsesquioxane resin does not undergo significant shrinkage.

The choice of substrates to be coated by the instant invention is limited only by the need for thermal and chemical stability of the substrate under the conditions used. It is contemplated, therefore, that the process of the invention could be used on electronic substrates and non-electronic substrates such as glass, wood, leather, textiles, metal, ceramics and plastics. Specific applications include any substrate where luminescence is desired such as on flat panel displays, television picture tubes, fluorescent lamps, phosphorescent paints and the like.

As used in the present invention, the expression "ceramic coating" is used to describe the hard coating obtained after heating the hydrogen silsesquioxane - phosphor filler composition. This coating contains both amorphous silica ($SiO_2$) materials as well as amorphous silica-like materials that may also contain residual carbon, silanol (Si—OH) and/or hydrogen (which are obtained upon heating the hydrogen silsesquioxane) and the phosphor filler materials. The expression "filler" is used to describe a finely divided solid phase which is distributed within the resin and the final ceramic coating. The expression "electronic substrate" is meant to include, but is not limited to, electronic devices or electronic circuits such as silicon based devices, gallium arsenide based devices, focal plane arrays, opto-electronic devices, photovoltaic cells and optical devices. The expression "phosphor" is used to describe crystalline compounds which absorb energy and emit electromagnetic radiation in excess of thermal radiation. The expression "luminescent coatings" is used to describe coatings containing phosphors which absorb energy and emit electromagnetic radiation in excess of thermal radiation.

In the process of the present invention a ceramic coating is formed on a substrate by a process which comprises applying a coating composition comprising hydrogen silsesquioxane resin and a phosphor filler onto the substrate and then heating the coated substrate at a temperature sufficient to convert the composition to a ceramic.

The hydrogen silsesquioxane resins (H-resin) which may be used in this invention include hydridosiloxane resins of the formula $HSi(OH)_x(OR)_yO_{z/2}$, in which each R is independently an organic group or a substituted organic group which, when bonded to silicon through the oxygen atom, forms a hydrolyzable substituent, x=0–2, y=0–2, z=1–3, x+y+z+=3. Examples of R include alkyls such as methyl, ethyl, propyl, butyl, etc., aryls such as phenyl, and alkenyls such as allyl or vinyl. As such, these resins may be fully condensed $(HSiO_{3/2})_n$ or they may be only partially hydrolyzed (i.e., containing some Si—OR) and/or partially condensed (i.e., containing some Si—OH). Although not represented by this structure, these resins may contain a small number (eg., less than about 10%) of silicon atoms which have either 0 or 2 hydrogen atoms attached thereto due to various factors involved in their formation or handling.

The above H-resins and methods for their production are known in the art. For example, Collins et al. in U.S. Pat. No. 3,615,272, which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Pat. Nos. 59-178749, 60-86017 and 63-107122, or any other equivalent hydridosiloxane, will also function herein.

It is to be noted that in a preferred embodiment of the invention, specific molecular weight fractions of the above H-resins may also be used in this process. Such fraction and methods for their preparation are taught by Hanneman et al. in U.S. Pat. No. 5,063,267 which is hereby incorporated by reference. A preferred fraction comprises material wherein at least 75% of the polymeric species have a molecular weight above about 1200 and a more preferred fraction comprises material wherein at least 75% of the polymeric species have a molecular weight between about 1200 and about 100,000.

The coating composition may also contain other ceramic oxide precursors. Examples of such ceramic oxide precursors include compounds of various metals such as aluminum, titanium, zirconium, tantalum, niobium and/or vanadium as well as various non-metallic compounds such as those of boron or phosphorous which may be dissolved in solution, hydrolyzed, and subsequently pyrolyzed, at relatively low temperatures and relatively rapid reaction rates to form ceramic oxide coatings.

The above ceramic oxide precursor compounds generally have one or more hydrolyzable groups bonded to the above metal or non-metal, depending on the valence of the metal. The number of hydrolyzable groups to be included in these compounds is not critical as long as the compound is soluble in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, or other organic groups bonded to said metal or non-metal through an oxygen such as acetylacetonate. Specific compounds, therefore, include zirconium tetracetylacetonate, titanium dibutoxy diacetylacetonate, aluminum triacetylacetonate and tetraisobutoxy titanium.

When hydrogen silsesquioxane resin is to be combined with one of the above ceramic oxide precursors, generally it is used in an amount such that the final ceramic coating contains 0.1 to about 30 percent by weight modifying ceramic oxide.

The coating composition may also contain a platinum, rhodium or copper catalyst to increase the rate and extent of conversion to silica. Generally, any platinum, rhodium or copper compound or complex which can be solubilized will be functional. For instance, a composition such as platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of hydrogen silsesquioxane resin.

The fillers used herein are known in the art for use in coatings with other polymers. These included various inorganic and organic fillers, especially inorganic fillers, in a variety of morphologies including, but not limited to powders, particles, flakes, microballoons and the like. Examples of inorganic fillers include synthetic and natural materials such as the oxides, nitrides, borides and carbides of various metals and non-metals such as glass, alumina, silica, titanium dioxide, zinc oxide, tungsten oxide, and ruthenium oxide, titanates such as potassium titanate and barium titanate, niobates such as lithium niobate and lead niobate, barium sulfate, calcium carbonate, precipitated diatomite, aluminum silicate or other silicates, pigments, phosphors, metals such as silver, aluminum and copper, wollostonite, mica, kaolin, clay, talc and the like. Also, some organic materials such as cellulose, polyamides, phenol resins and the like may be used.

The preferred fillers to be used herein are phosphors. Many of such materials are known in the art and commercially available. Examples include sulfides, selenides and sulfoselenides such as zinc sulfide and cadmium sulfide, oxysulfides, oxygen dominant phosphors such as borates, aluminates, gallates, silicates, and the like and halide phosphors such as alkali metal halides, alkaline earth halides and oxyhalides. Preferred are sulfides and most preferred is zinc sulfide.

The phosphor compounds may also be doped with activators. These include, for example manganese, silver and copper. Examples of other activators include rare earth ions which may, for instance, be in the form of halides (eg., fluorides). Such activators are generally present in amounts of about 0.1–10 mol percent based on the phosphor.

The particle size and shape of the above phosphor fillers can vary over a wide range depending on factors such as the type of filler, the desired coating thickness, etc. Since the coatings are generally less than about 500 microns thick, particle sizes less than this are generally used. Preferred size particles are generally in the range of less than about 100 microns, more preferred particle sizes are in the range of less than about 50 microns and the most preferred particles are in the range of submicron to 10 microns.

The amount of phosphor filler used in the present invention can also be varied over a wide range depending, for example, on the characteristics desired in the final coating. Generally, however, the fillers are used in an amount less than about 90 weight percent based on the weight of the hydrogen silsesquioxane resin to insure that enough resin is present to bind the filler. Obviously, smaller amounts of fillers (eg., 1–5 wt %) can also be used.

If desired, other materials may also be present in the coating composition. For instance, it is within the scope of the present invention to use a material which modifies the surface of the filler for better adhesion. Such materials can include, for example, silanes such as glycidoxypropyltrimethoxysilane, mercaptopropyltrimethoxysilane, and vinyltriacetoxysilane. Similarly, it is within the scope of the invention to include suspending agents in the coating composition. These and other optional components are known to those skilled in the art.

According to the process of the invention, the H-resin, phosphor filler and any optional components are applied to the surface of a substrate. This can be accomplished in any manner, but a preferred method involves dissolving the H-resin in a solvent and dispersing the filler and any optional components therein. This dispersion is then applied to the surface of the substrate. Various facilitating measures such as stirring and/or heating may be used to dissolve or disperse the H-resin and filler and create a more uniform application material. Solvents which may be used include any agent or mixture of agents which will dissolve or disperse the H-resin and filler to form a homogenous liquid mixture without affecting the resultant coating. These solvents can include, for example, alcohols such as ethyl or isopropyl, aromatic hydrocarbons such as benzene or toluene, alkanes such as n-heptane or dodecane, ketones, esters, ethers, or cyclic dimethylpolysiloxanes, in an amount sufficient to dissolve/disperse the above materials to the concentration desired for application. Generally, enough of the above solvent is used to form a 0.1–80 weight percent mixture, preferably 1–50 wt. percent.

If a liquid method is used, the liquid mixture comprising the H-resin, phosphor filler, solvent, and, any optional components is then coated onto the substrate. The method of coating can be, but is not limited to, spin coating, dip coating, spray coating or flow coating. Other equivalent means, however, are also deemed to be within the scope of this invention.

The solvent is then allowed to evaporate from the coated substrate resulting in the deposition of the hydrogen silsesquioxane resin and phosphor filler coating. Any suitable means of evaporation may be used such as simple air drying by exposure to an ambient environment, by the application of a vacuum or mild heat (eg., less than 50° C.) or during the early stages of the heat treatment. It is to be noted that when spin coating is used, the additional drying period is minimized as the spinning drives off the solvent.

Although the above described methods primarily focus on using a liquid approach, one skilled in the art would recognize that other equivalent means would also function herein and are contemplated to be within the scope of this invention.

The hydrogen silsesquioxane resin and phosphor filler coating is then typically converted to the ceramic by heating it to a sufficient temperature. Generally, the temperature is in the range of about 50° to about 1000° C. depending on the pyrolysis atmosphere. Preferred temperatures are in the range of about 50° to about 800° C. and more preferably 50°–500° C. Heating is generally conducted for a time sufficient to ceramify, generally up to about 6 hours, with less than about 3 hours being preferred.

The above heating may be conducted at any effective atmospheric pressure from vacuum to superatmospheric and under any effective oxidizing or non-oxidizing gaseous environment such as those comprising air, $O_2$, an inert gas ($N_2$, etc.), ammonia, amines, moisture, $N_2O$, hydrogen, etc.

Any method of heating such as the use of a convection oven, rapid thermal processing, hot plate, or radiant or microwave energy is generally functional herein. The rate of heating, moreover, is also not critical, but it is most practical and preferred to heat as rapidly as possible.

By the above methods a ceramic coating is produced on the substrate. The thickness of the coating can vary over a wide range (eg., up to 500 microns) as described above. These coatings smooth the irregular surfaces of various substrates (i.e. planarizing), they are relatively defect free and they have excellent adhesive properties.

The coatings are also luminescent when exposed to an excitation source. Such sources generally include photons and electrons. Specific sources include infrared, visible and ultraviolet radiation, x-rays, cathode rays, electric fields, and electric current.

Additional coatings may be applied over these coatings if desired. These can include, for example, $SiO_2$ coatings, $SiO_2$/ceramic oxide layers, silicon containing coatings, silicon carbon containing coatings, silicon nitrogen containing coatings, silicon oxygen nitrogen coatings, silicon nitrogen carbon containing coatings and/or diamond like carbon coatings. Methods for the application of such coatings are known in the art and many are described in U.S. Pat. No. 4,756,977, which is incorporated herein by reference. An especially preferred coating is silicon carbide applied by the chemical vapor deposition of silacyclobutane. This process is described in U.S. Pat. No. 5,011,706 which is incorporated herein by reference.

The following non-limiting examples are included so that one skilled in the art may more readily understand the invention.

EXAMPLE 1

Eccospheres™ DCT-28-27 (silica glass microballoons with a particle size range of 10–40 microns), 0.2 g, were ground in a mortar and pestle for about 20 minutes to decrease the particle size. A coating composition was then formed by mixing the ground glass, 0.7 g of Hydrogen silsesquioxane resin made by the method of Collins et al. in U.S. Pat. No. 3,615,273, and 0.012 g glycidoxypropyltrimethoxysilane and 0.36 g dodecane. The coating composition was applied to the surface of 2—3"×5" aluminum panels; one using a 3 mil applicator to apply a 2 mil coating and the second using a 4 mil applicator to apply a 3 mil coating. The coatings were allowed to dry for 1 hour at 64° C. The coated panels were then heated at 185° C. for 1 hour and at 410° C. for 45 minutes. The dielectric constant and dissipation factor for the 3 mil coating are as follows:

| Frequency | Dielectric Constant | Dissipation Factor |
| --- | --- | --- |
| 100 Hz | 2.43 | 0.106 |
| 1 kHz | 2.21 | 0.097 |
| 10 kHz | 2.13 | 0.019 |
| 100 kHz | 2.08 | 0.009 |

The spheres had a dielectric constant =1.17(1–8.6 GHz) and dissipation factor =0.001(1 –8.6 GHz).

EXAMPLE 2

A coating composition was formed by mixing 0.12 g Eccospheres SDT-28-27 (not crushed), 0.12 g 5 micron Minusil (silica), 0.7 g of Hydrogen silsesquioxane resin made by the method of Collins et al. in U.S. Pat. No. 3,615,273, 0.012 g glycidoxypropyltrimethoxysilane and 0.456 g dodecane. The coating composition was applied to the surface of various substrates and processed as set out in the following table:

| Substrate | Film Applicator | Air Dry | 185° C. | 410° C. | Thickness (micron) |
| --- | --- | --- | --- | --- | --- |
| 3" × 6" Al Panel | 3 mil | 3 h | 1.75 h | 1.25 h | 20 |
| 3" × 6" Al Panel | 4 mil | 3 h | 1.75 h | 1.25 h | 41 |
| 3" × 6" Al Panel | 5 mil | 3 h | 1.75 h | 1.25 h | 48 |
| 3" Si Wafer | 3 mil | 3 h | 0.75 h | 1.00 h | 24 |
| 2" sq 1000 nm gold on nichrome | 3 mil | 3 h | 0.75 h | 1.00 h | 22 |
| 2" sq wafer - Al coated | 6 mil | 3 h | 0.75 h | 1.00 h | 42 |
| Al interdigitated pattern on 2" Si wafer | 6 mil | 3 h | 0.75 h | 1.00 h | 22 |

The aluminum interdigitated pattern on the silicon wafer coated above was tested for porosity, pinhole density, and barrier layer ability by MIL STD 883C, Method 2021-3, Procedure B, for determining glassivation layer integrity with a phosphoric acid etch solution. The Etch solution consists of 16 parts conc. phosphoric acid, 2 parts deionized water, 1 part concentrated nitric acid and 1 part glacial acetic acid. The sample was tested by applying 1 drop of the etch solution on the surface of the coating for a period of 50 minutes (30 minutes =normal exposure time). The sample was next rinsed with distilled water and allowed to dry. Examination of the test area on the coating showed the film was intact and there was no evidence of any corrosion. The dielectric constant and dissipation factor for the 3"×6" aluminum panel coated above with the 41 micron thick coating are as follows:

| Frequency | Dielectric Constant | Dissipation Factor |
| --- | --- | --- |
| 100 Hz | 2.42 | 0.032 |
| 1 kHz | 2.35 | 0.014 |
| 10 kHz | 2.32 | 0.006 |
| 100 kHz | 2.31 | 0.004 |

EXAMPLE 3

A coating composition was formed by mixing 0.12 g Eccospheres SDT-28-27 (not crushed), 0.12 g plasma alumina, average particle size =6 microns (Product No. 13,699, ZYP Coatings, Inc.), 0.7 g of Hydrogen silsesquioxane resin made by the method of Collins et al. in U.S. Pat. No. 3,615,273, 0.012 g glycidoxypropyltrimethoxysilane and 0.456 g dodecane. The coating composition was applied to the surface of a 3"×5" aluminum panel using a 3 mil applicator. The coatings were allowed to dry for 3 hours at 64° C. The coated panels were then heated at 185° C. for 1 hour and at 400° C. for 1 hour. A 31 micron thick coating was obtained. The dielectric constant and dissipation factor for the coating are as follows:

| Frequency | Dielectric Constant | Dissipation Factor |
| --- | --- | --- |
| 100 Hz | 2.04 | 0.058 |
| 1 kHz | 1.94 | 0.030 |
| 10 kHz | 1.87 | 0.020 |
| 100 kHz | 1.82 | 0.015 |

EXAMPLE 4

A coating composition was formed by mixing 0.15 g plasma alumina, average particle size =6 microns (Product No. 13,699, ZYP Coatings, Inc.), 0.7 g of Hydrogen silsesquioxane resin made by the method of Collins et al. in U.S. Pat. No. 3,615,273, 0.024 g glycidoxypropyltrimethoxysilane and 0.271 g dodecane. The coating composition was applied to the surface of a 3"×5" aluminum panel using a 2 mil applicator. The coatings were allowed to dry for 4 hours at 64° C. The coated panels were then heated at 185° C. for 1 hour and at 400° C. for 1 hour. A 36 micron thick coating was obtained. The dielectric constant and dissipation factor for the coating are as follows:

| Frequency | Dielectric Constant | Dissipation Factor |
| --- | --- | --- |
| 100 Hz | 2.23 | 0.038 |
| 1 kHz | 2.15 | 0.017 |
| 10 kHz | 2.12 | 0.008 |
| 100 kHz | 2.10 | 0.005 |

EXAMPLE 5

Nalco 84SS-258 (30% colloidal silica with a particle size of 20 nanometer diluted in a glycol propyl ether), 1.08 g, 0.6 g of Hydrogen silsesquioxane resin made by the method of Collins et al. in U.S. Pat. No. 3,615,273, and 1.08 g 2-(2-butoxyethoxy)ethyl acetate were mixed in 1.11 g methyl ethyl ketone. The coating composition was applied to the surface of 10 Motorola 14011B CMOS devices and spun at 3000 RPM for 10 seconds. A 1 inch square silicon wafer was also coated in the same manner. The coated materials were then heated at 400° C. for 2.5 hours in air. The CMOS devices were all functional after pyrolysis. Salt atmosphere tests per MIL-STD-883C, method 1009 showed that 7 out of 10 passed 2 hours and 3 of 7 passed 4 hours in the test. A similar coating of silica derived from H-resin failed after 10 minutes in the test.

EXAMPLE 6

Nalco 84SS-258 (30% colloidal silica with a particle size of 20 nanometer diluted in a glycol propyl ether), 2.163 g, 2.0 g of triethoxysilane, 0.164 g water, 9.49 g isopropyl alcohol and 3.0 g n-butanol were mixed and heated at 60°–75° C. for 30 minutes. The coating composition was applied to the surface of 1×3 inch aluminum panel. The coated panel was air dried for 10 minutes and pyrolyzed at 400° C. for 1 hour in air. A Motorola 14011B CMOS device and a 1 square inch silicon wafer were also spin coated with the above liquid mixture at 3000 RPM for 15 seconds. The coated parts were then heated at 400° C. for 4 hours in air. FTIR showed essentially complete conversion to silica. The CMOS device was functional after pyrolysis and survived 4 hours of the salt atmosphere tests of Example 5 (failed at 24 hours).

EXAMPLE 7

A coating composition was formed by mixing 0.2 g of Hydrogen silsesquioxane resin made by the method of Collins et al. in U.S. Pat. No. 3,615,273, 0.82 g ZnS:Mn (6.28 wt % Mn based on ZnS), 0.075 g glycidoxypropyltrimethoxysilane and 0.164 g cyclic dimethylsiloxanes. The coating composition was applied to the surface of an 11.4 cm square alumina tape panel using a 3 mil drawndown bar. The coating was allowed to dry for 4 hours and 45 minutes. The coated panel was then heated at 400° C. for 1 hour in air.

The coating was 65 micrometers thick and had no cracks when examined at 1000×. The coating was exposed to UV light and was found to afford a yellow-orange photoluminescence.

EXAMPLE 8

A coating composition was formed by mixing (with a biohomogenizer) 1.0 g of Hydrogen silsesquioxane resin made by the method of Collins et al. in U.S. Pat. No. 3,615,273, 4.0 g ZnS, 0.3 g glycidoxypropyltrimethoxysilane and 1.0 g cyclic dimethylsiloxanes. The coating composition was applied to the surface of an 7.5×15 cm aluminum panel using a 3 mil drawndown bar. The coating was allowed to dry for 2 hours and 20 minutes. The coated panel was then heated at 500° C. for 1 hour in air.

The coating was 22 micrometers thick and had no cracks when examined at 1000×. The coating was exposed to UV light and was found to afford a weak green photoluminescence.

What is claimed is:

1. A method of forming a luminescent coating on a substrate comprising:

applying a coating composition comprising hydrogen silsesquioxane resin and a phosphor filler onto a substrate; and heating the coated substrate at a temperature sufficient to convert the coating composition into a ceramic coating.

2. The method of claim 1 wherein the coating composition is applied to the substrate by a process which comprises coating the substrate with a liquid mixture comprising a solvent, the hydrogen silsesquioxane resin and the filler and then evaporating the solvent.

3. The method of claim 2 wherein the coated substrate is heated at a temperature in the range of between about 50° C. and about 800° C. for less than about 3 hours.

4. The method of claim 1 wherein the coating composition also contains modifying ceramic oxide precursors comprising a compound containing an element selected from the group consisting of titanium, zirconium, aluminum, tantalum, vanadium, niobium, boron and phosphorous wherein the compound contains at least one hydrolyzable substituent selected from the group consisting of alkoxy and acyloxy and the compound is present in an amount such that the coating contains 0.1 to 30 percent by weight modifying ceramic oxide.

5. The method of claim 1 wherein the coating composition also contains a platinum, rhodium or copper catalyst in an amount of between about 5 and about 500 ppm platinum, rhodium or copper based on the weight of hydrogen silsesquioxane resin.

6. The method of claim 1 wherein the coating composition also contains a material which modifies the surface of the filler.

7. The method of claim 1 wherein the coating composition also contains a suspending agent.

8. The method of claim 1 wherein the filler is selected from the group consisting of zinc sulfide and cadmium sulfide.

9. The method of claim 1 wherein the filler has a particle size in the range of less than about 50 microns.

10. The method of claim 1 wherein the filler is present in the coating composition in an amount less than about 90 weight percent.

* * * * *